United States Patent [19]
Uehara

[11] Patent Number: 6,016,070
[45] Date of Patent: Jan. 18, 2000

[54] PULSE EXTENDING CIRCUIT

[75] Inventor: Hidenori Uehara, Tokyo, Japan

[73] Assignee: Oki Electric Industry Co., Ltd., Tokyo, Japan

[21] Appl. No.: 08/743,363

[22] Filed: Nov. 4, 1996

[30] Foreign Application Priority Data

Jun. 28, 1996 [JP] Japan ................................. 8-169904

[51] Int. Cl.[7] .............................. H03K 5/00; H03K 3/017
[52] U.S. Cl. ............................ 327/176; 327/552; 327/34; 327/166; 327/174
[58] Field of Search .................................... 327/551, 552, 327/261, 262, 263, 34, 173, 174, 311, 291, 292, 176

[56] References Cited

U.S. PATENT DOCUMENTS

| | | | |
|---|---|---|---|
| 5,672,990 | 9/1997 | Chaw | 327/174 |
| 5,682,113 | 10/1997 | Park et al. | 327/261 |

OTHER PUBLICATIONS

"CMOS Delay Circuit", IBM Technical Disclosure Bulletin, vol. 27, No. 12, May 1985, pp. 7134–7135.

Primary Examiner—Dinh T. Le
Attorney, Agent, or Firm—Jones Volentine, LLP

[57] ABSTRACT

The present invention provides a timing circuit for outputting a signal having an amplified pulse width when a signal having a normal pulse width is inputted thereto, characterized in that when glitch noise whose pulse width is small, is inputted to the timing circuit, a signal having a waveform corresponding to the pulse width thereof is outputted from the timing circuit. The timing circuit comprises a first delay circuit whose input is connected to an input terminal, a first NAND circuit having a first input terminal connected to the first delay circuit and a second input terminal connected to the input terminal, a second delay circuit whose input is connected to the output of the NAND circuit, an inverter whose input is connected to the input terminal, and a second NAND circuit having a first input terminal connected to the output of the second delay circuit and a second input terminal connected to the output of the inverter.

12 Claims, 5 Drawing Sheets

(a) IN
(b) NODE 1
(c) NODE 2
(d) OUTPUT OF 42
(e) OUT (f) IN
(g) NODE 1
(h) NODE 2
(i) OUTPUT OF 42
(j) OUT

PULSE EXTENDING CIRCUIT

BACKGROUND OF THE INVENTION

1. Field of the Invention

This invention relates to a timing circuit suitable for use in a DRAM or the like.

2. Description of the Related Art

A timing circuit has heretofore been known which has an inverter electrically connected to an input terminal, a RC delay circuit electrically connected to the output of the inverter and a two-input NAND circuit whose inputs are respectively electrically connected to the output of the RC delay circuit and the output of the inverter. A signal outputted from the timing circuit immediately changes from an L to an H levels in response to a change of an input signal from an L to an H levels. Further, the output signal also changes from an H to an L levels after a predetermined period has elapsed since the change of the input signal from the H to the L levels. Namely, the timing circuit outputs a signal having a pulse broader wider than that of the input signal.

However, although described in detail later, the conventional timing circuit outputs a signal which changes from an H to an L levels after a predetermined period has elapsed since a change of glitch noise from an H to an L levels even when the glitch noise is inputted to the input terminal. Namely, the timing circuit serves so as to broaden even a pulse width of the glitch noise. Accordingly, a circuit supplied with the output signal referred to above was apt to cause a malfunction.

SUMMARY OF THE INVENTION

With the-foregoing in view, it is an object of the present invention to provide a timing circuit capable of outputting a signal having a waveform corresponding to a pulse width of glitch noise when the glitch noise or the like is inputted thereto.

According to one aspect of the present invention, for achieving the above object, there is provided a timing circuit of the present invention, comprising:

an input terminal;

a first delay circuit whose input is connected to the input terminal;

a first NAND circuit having a first input terminal connected to the first delay circuit and a second input terminal connected to the input terminal;

a second delay circuit whose input is connected to an output of the NAND circuit;

an inverter whose input is connected to the input terminal; and a second NAND circuit having a first input terminal connected to an output of the second delay circuit and a second input terminal connected to an output of the inverter.

The present application discloses other various inventions made to achieve the object. These inventions will be understood from the appended claims, the following embodiments and the accompanying drawings.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
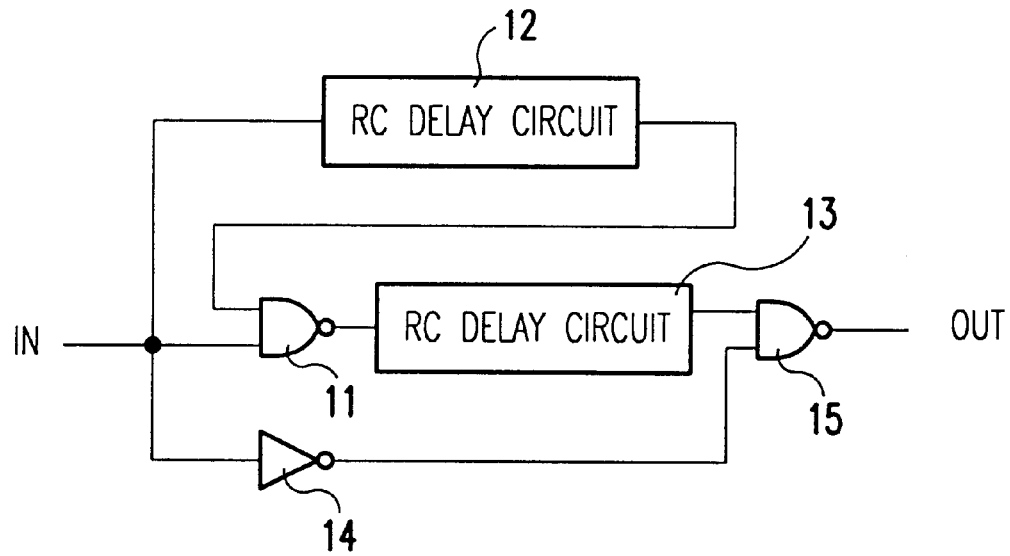
FIG. 1 is a circuit diagram showing a first embodiment of the present invention.

FIG. 1 is a circuit diagram showing a first embodiment of the present invention.

The circuit shown in FIG. 1 comprises two RC delay circuits 12 and 13, two NAND circuits 11 and 15 and an inverter 14.

An input signal IN is inputted to the first RC delay circuit 12 and the output of the RC delay circuit 12 is electrically connected to a first input terminal of the first NAND circuit 11. A second input terminal of the first NAND circuit 11 is supplied with the input signal IN and an output terminal thereof is electrically connected to the input of the second RC delay circuit 13. The output of the second RC delay circuit 13 is electrically connected to a first input terminal of the second NAND circuit 15. A second input terminal of the second NAND circuit 15 is supplied with a signal obtained by inverting the input signal IN by the inverter 14.

Figure 2:
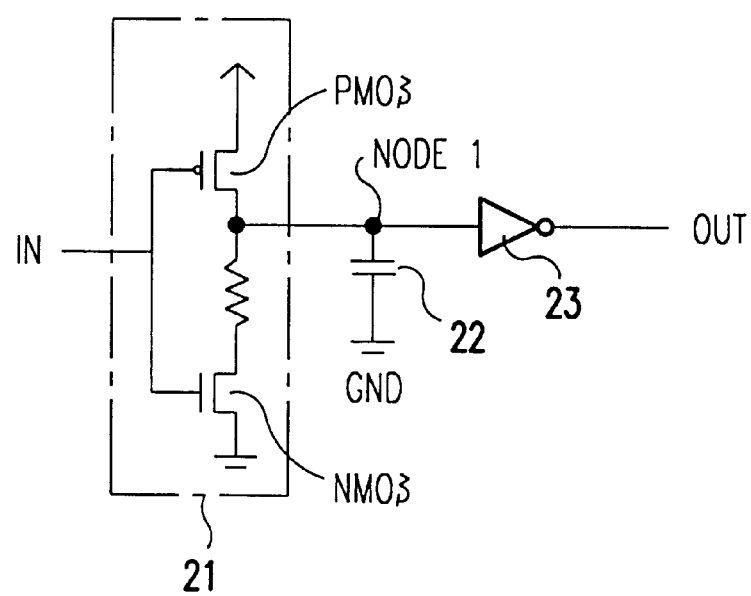
FIG. 2 is a circuit diagram illustrating a delay circuit employed in the circuit shown in FIG. 1.

Each of the RC delay circuits 12 and 13 shown in FIG. 1 has a circuit configuration shown in FIG. 2 and comprises a first inverter 21, a second inverter 23 and a capacitor 22 electrically connected between the output of the first inverter 21 and a ground potential GND.

The first inverter 21 has a PMOS electrically connected between a source potential and the output thereof and a resistor R and an NMOS both electrically connected between the output of the PMOS and the ground potential.

The operation of the RC delay circuit will now be described. 1) When an input signal in changes from an H level to an L level, the PMOS of the inverter 21 is turned ON so that a potential is supplied to a node 1 (corresponding to the output of the inverter 21) from the source potential. Accordingly, the capacitor 22 is charged. Since the ability of the PMOS to supply the potential to the node 1 is set high, the capacitor 22 is immediately charged. After the capacitor 22 has been charged, the level of the potential applied to the node 1 is brought to an H level so that an output signal out is rendered L in level. 2) When the input signal in changes from the L to H levels, the NMOS of the inverter 21 is turned ON. Accordingly, the electrical charge stored in the capacitor 22 is discharged to GND through the resistor R and the NMOS. However, since the resistor R is provided along a discharge path in this case, the capacitor 22 is gradually discharged. Thus, when the potential at the node 1 is gradually reduced and the potential thereat exceeds a threshold value of the inverter 23, the inverter 23 outputs an H level. Namely, the output signal out changes from the L to H levels after a predetermined period has elapsed since the change of the input signal in from the L to H levels.

Figure 3:
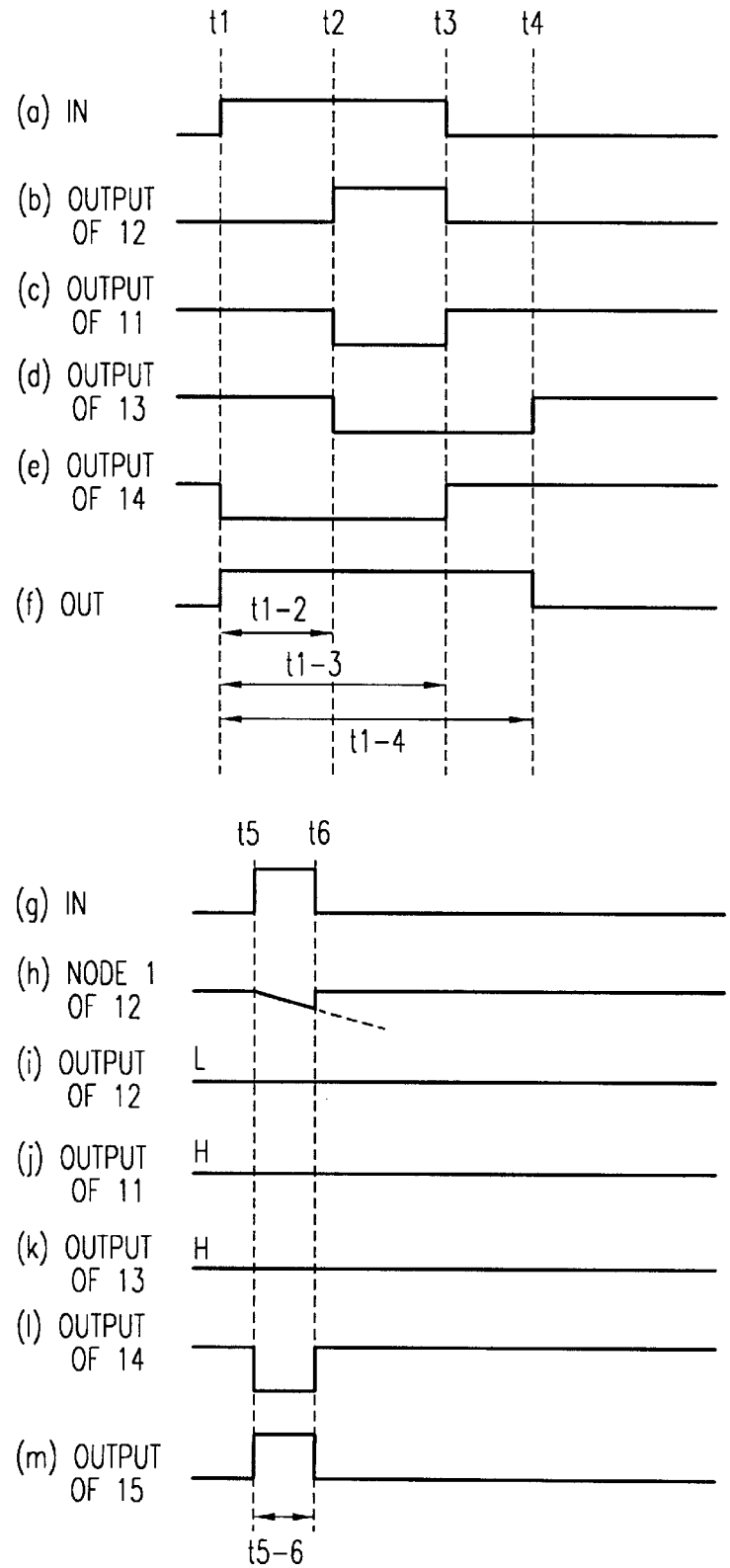
FIG. 3 is a timing chart for describing the operation of the circuit shown in FIG. 1.

The operation of the circuit shown in FIG. 1 will next be described using a timing chart shown in FIG. 3. However, the configuration and operation of a circuit used for comparison will first be explained to provide easy understanding of an effect obtained by the circuit shown in FIG. 1.

Figure 4:
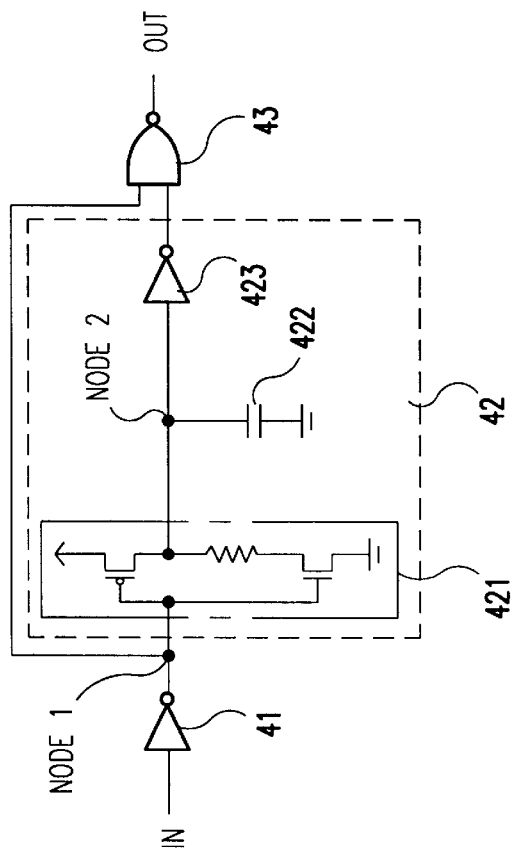
FIG. 4 is a circuit diagram depicting a circuit used for comparison.

FIG. 4 is a circuit diagram showing the circuit used for comparison.

The circuit shown in FIG. 4 comprises a RC delay circuit 42, a NAND circuit 43 and an inverter 41.

An input signal IN is inputted to the inverter 41 and an output produced from the inverter 41 is inputted to the RC delay circuit 42. The output of the RC delay circuit 42 and the output of the inverter 41 are respectively electrically connected to a first and a second input terminals of the NAND circuit 43. Since the RC delay circuit 42 is identical in configuration to the circuit shown in FIG. 2, its description will be omitted.

Figure 5:
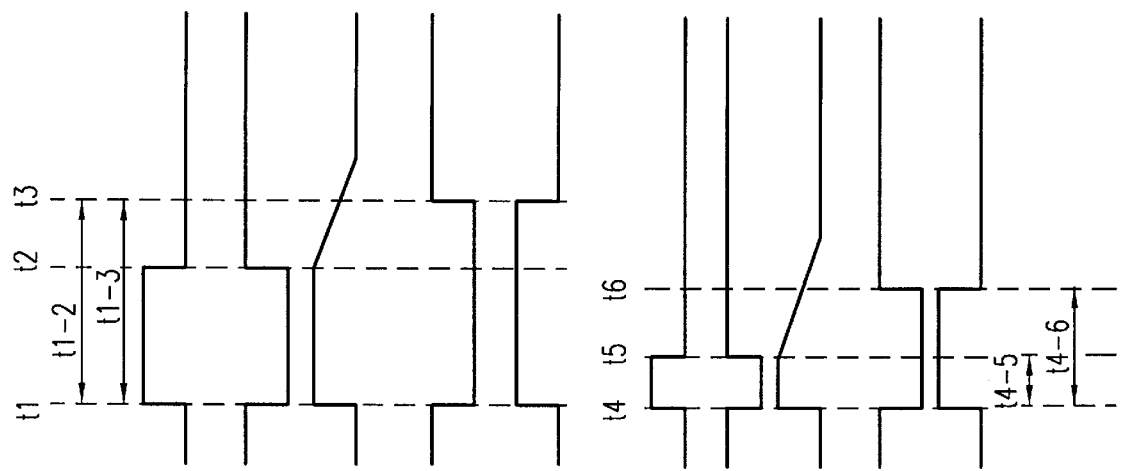
FIG. 5 is a timing chart for describing the operation of the circuit shown in FIG. 4.
Figure 5:
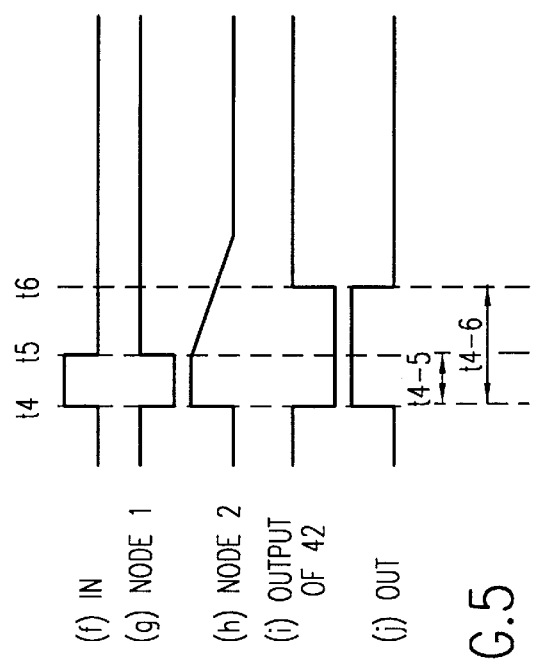

FIG. 5 is a timing chart for describing the operation of the circuit shown in FIG. 4.

Here, consideration will not be given to a delay time or the like introduced from one inverter for simplicity of illustration.

A description will be made of the case in which as shown in FIG. 5(a), an input signal IN is inputted which first changes from an L to an H levels at a time t1 and then changes from the H to L levels after having been maintained at the H level during a desired period (t1 to t2). Symbol tl to t2 indicates a period from the times t1 to t2.

The potential at a node 1 (corresponding to the output of the inverter 41) is changed from an H to an L levels in response to the change of the input signal IN from the L to H levels (time t1) (see FIGS. 5(a) and 5(b)). When the potential at the node 1 is brought to the L level, an output signal OUT is rendered H in level. On the other hand, when the potential at the node 1 is brought to the L level, a PMOST which constitutes an inverter 421, is turned ON so that the potential at a node 2 is brought to an H level. Since the ability of the PMOS to supply the potential to the node 2 is set high, a capacitor 422 is immediately charged (see FIG. 5(c)). When the potential at the node 2 is H in level, a signal outputted from an inverter 423 is brought to an L level (see FIG. 5(d)).

Next, when the input signal IN changes from the H to L levels (time t2) after having been maintained at the H level during the desired period (t1 to t2), an NMOS of the inverter 421 is turned ON so that the electrical charge stored in the capacitor 422 is gradually discharged to GND through a resistor R and the NMOS. Accordingly, the potential at the node 2 is gradually lowered (see FIG. 5(c)). Further, when the potential at the node 2 exceeds a threshold value of the inverter 423 (time t3), the inverter 423 outputs an H level (see FIG. 5(d)). Thus, the output signal OUT is brought to an L level (see FIG. 5(e)).

However, when glitch noise occurs, the input signal IN becomes a signal whose H level period (corresponding to a period of t4 to t5) is short. In this case, the potential at the node 1 changes from an H to an L levels in response to the change of the input signal IN from the L to H levels (see FIGS. 5(f) and 5(g)). When the potential at the node 1 is rendered L in level, the potential at the node 2 is brought to an H level (see FIG. 5(h)). When the potential at the node 2 is H in level, the signal outputted from the inverter 423 becomes L in level (see FIG. 5(i)). Thus, the output signal OUT becomes H in level (see FIG. 5(j)).

Next, when the input signal IN changes from the H to L levels (time t5), the NMOS of the inverter 421 is turned ON so that the electrical charge stored in the capacitor 422 is gradually discharged to GND through the resistor R and the NMOS. Thus, the potential at the node 2 is gradually reduced (see FIG. 5(i)). Further, when the potential at the node 2 exceeds the threshold value of the inverter 423 (time t6), the inverter 423 outputs an H level (see FIG. 5(i)). Accordingly, the output signal OUT becomes L in level (see FIG. 5(j)). Thus, even when the glitch noise occurs, an output signal (pulse width: t4 to t6) obtained by broadening the pulse width (t4 to t5) of the input signal is outputted.

When such an output signal is inputted to other circuit, a desired operation might not be performed.

On the other hand, when the input signal has a desired pulse width, the circuit shown in FIG. 1 broadens the pulse width of the output signal. When the glitch noise is inputted to the circuit, the circuit outputs the glitch noise as it is without broadening the pulse width.

The operation of the circuit shown in FIG. 1 will be described below with reference to the timing chart shown in FIG. 3.

A description will be made of the case in which as shown in FIG. 3(a), an input signal IN is inputted which first changes from an L to an H levels at a time t1 and then changes from the H to L levels after having been maintained at the H level during a desired period (t1 to t3).

As has been described in detail by reference to FIG. 2, the signal outputted from the RC delay circuit immediately changes from the H to L levels in response to the change of the input signal from the H to L levels. However, when the input signal changes from the L to H levels, the output signal of the RC delay circuit changes from the L to H levels after the predetermined period has elapsed.

Thus, the signal outputted from the RC delay circuit changes from the L to H levels after a predetermined period (corresponding to a period of t1 to t2) in response to the change of the input signal IN from the L to H levels (time t1).

Further, the signal outputted from the RC delay circuit immediately changes from the H to L levels in response to a change of the input signal IN from the H to L levels (time t3).

Namely, the input signal and the output of the RC delay circuit 12 become L levels respectively till the time t1. During the period from the times t1 to t2, the input signal and the output of the RC delay circuit 12 become an H level and an L level respectively. During a period from the times t2 to t3, the input signal and the output of the RC delay circuit 12 become H levels respectively. The input signal and the output of the RC delay circuit 12 become L levels subsequently to the time t3 (see FIGS. 3(a) and 3(b)). Accordingly, a signal outputted from the NAND circuit 11 is maintained at an H level till the time t2, at an L level during the period from the times t2 to t3 and at the H level subsequently to the time t3 (see FIG. 3(c)).

Further, when the input signal changes from the L to H levels, the signal outputted from the RC delay circuit 13 also changes from the L to H levels after a predetermined period has elapsed. Therefore, the output signal of the RC delay circuit 13 is maintained at an L level during a period from the times t2 to t4 (t4 >t3) (see FIG. 3(d)).

On the other hand, the signal outputted from the inverter 14 is maintained at an L level during a period from the times t1 to t3 (see FIG. 3(e)). Accordingly, an output signal OUT is maintained at an H level during a period from the times t1 to t4 (see FIG. 3(f)).

Thus, the circuit shown in FIG. 1 outputs a signal having a pulse width (t1 to t4) obtained by amplifying a pulse width (t1 to t3) of the input signal.

A description will next be made of a case in which the glitch noise occurs.

In this case, an input signal becomes a signal whose H level period (corresponding to a period of t5 to t6) is short. In this case, the potential at the node 1 of the RC delay circuit 12 starts to gradually drop from an H level in response to a change of the input signal from an L to an H levels (time t5)(see FIG. 3(h)). However, since the input signal changes from the H to L levels (time t6) before the potential at the node 1 exceeds the threshold value of the inverter 23, the signal (corresponding to the output signal of the RC delay circuit 13) outputted from the inverter 23 is maintained at an L level (see FIG. 3(i)). Accordingly, the signal outputted from the NAND circuit 11 is maintained at an H level (see FIG. 3(j)) and the output of the RC delay circuit 13 is also maintained at the H level (see FIG. 3(k)).

On the other hand, since the output of the inverter 14 becomes L in level during the period from the times t5 to F6, th e output signal of the NAND circuit 15 is maintained at an H level only during the period from the times t5 to t6.

Thus, when the glitch noise is produced, the circuit shown in FIG. 1 generates an output signal having a pulse width (t5 to t6) corresponding to a pulse width (t5 to t6) of the produced noise. Accordingly, since the signal whose pulse width is broad, is not inputted to the circuit of the following stage, it is possible to prevent the circuit from malfunctioning.

If a delay time of the RC delay circuit 12 is set so as to correspond to the pulse width (t1 to t3) of the input signal, which has been set in advance, then a signal having a pulse whose width is less than or equal to the pulse width (t1 to t3), is judged to be noise and hence the pulse width of the output signal OUT is kept constant.

Further, a delay time of the RC delay circuit 13 can be suitably set depending on to which extent the pulse width of the input signal should be broadened.

These RC delay circuits can be suitably changed to other ones other than the circuit shown in FIG. 2.

Figure 6:
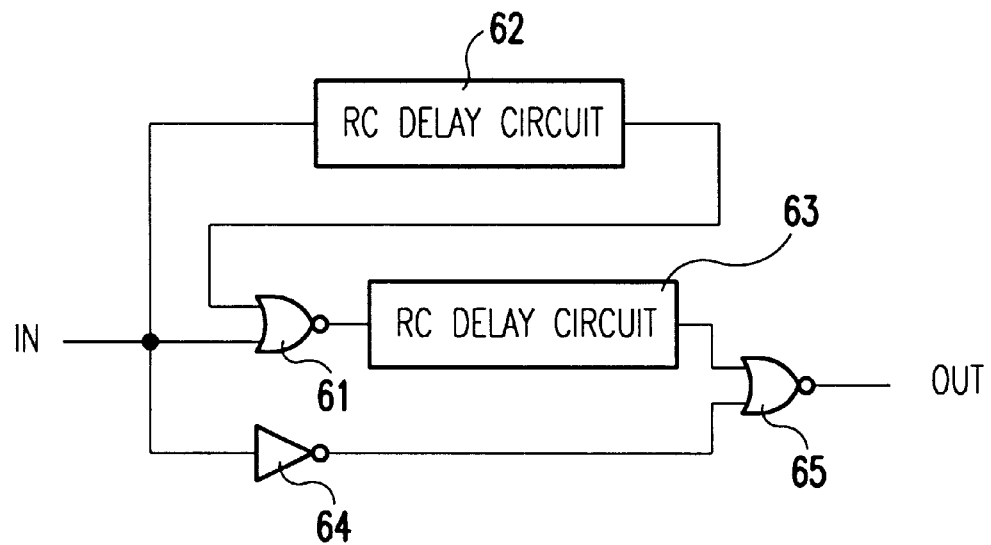
FIG. 6 is a circuit diagram illustrating a second embodiment of the present invention.

FIG. 6 is a circuit diagram showing a second embodiment of the present invention.

The circuit shown in FIG. 6 has two RC delay circuits 62 and 63, two NOR circuits 61 and 65 and an inverter 64.

The first RC delay circuit 62 is supplied with an input signal IN and the output of the RC delay circuit 62 is electrically connected to a first input terminal of the first NOR circuit 61. A second input terminal of the first NOR circuit 61 is supplied with the input signal IN and an output terminal of the first NOR circuit 61 is electrically connected to the input of the second RC delay circuit 63. The output of the RC delay circuit 63 is electrically connected to a first input terminal of the second NOR circuit 65 and a second input terminal of the second NOR circuit 65 is supplied with a signal obtained by inverting the input signal IN by the inverter 64.

Figure 7:
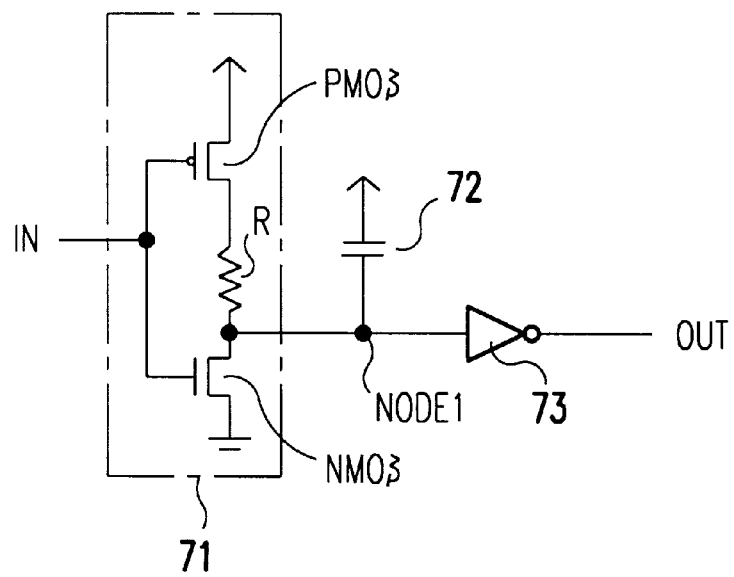
FIG. 7 is a circuit diagram showing a delay circuit employed in the circuit shown in FIG. 6.

Each of the RC delay circuits 62 and 63 shown in FIG. 6 has a circuit configuration shown in FIG. 7 and comprises a first inverter 71, a second inverter 73 and a capacitor 72 electrically connected between the output of the first inverter 71 and a source potential.

The first inverter 71 has a PMOS and a resistor R electrically series-connected between the source potential and the output thereof and an NMOS electrically connected between the output thereof and a ground potential. Next, since the RC delay circuit shown in FIG. 7 is activated in reverse as compared with the circuit shown in FIG. 2, the description of its operation will be omitted.

Figure 8:
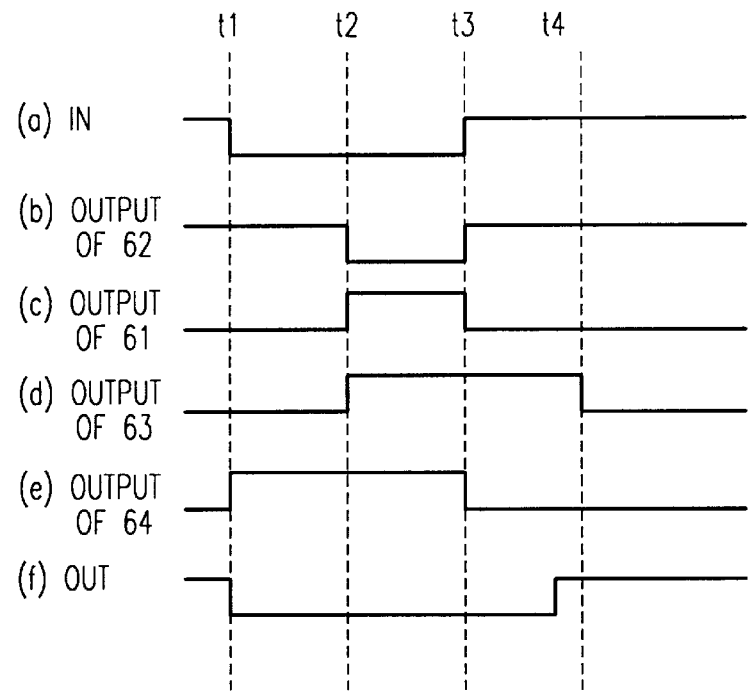
FIG. 8 is a timing chart for describing the operation of the circuit shown in FIG. 6.
Figure 8:
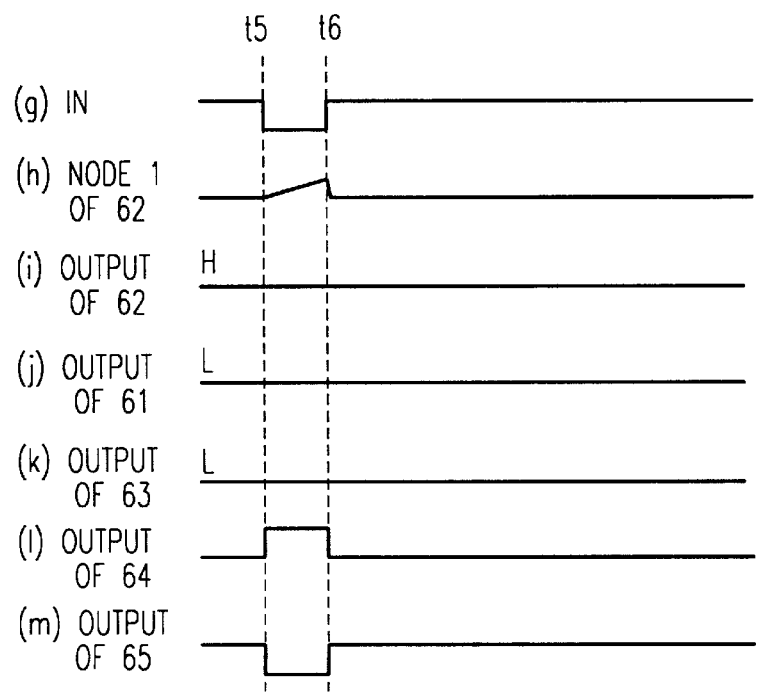

Operations at the respective components of the circuit shown in FIG. 6 are respectively shown in a timing chart illustrated in FIG. 8. Since a logic level of the circuit shown in FIG. 6 is operated in reverse as compared with the circuit shown in FIG. 1, which has been described previously in detail, the description of its operation will be omitted.

If a delay time of the RC delay circuit 62 is set so as to correspond to a pulse width of the input signal, which has been set in advance, then a signal having a pulse whose width is less than or equal to that pulse width, is judged to be noise and hence a pulse width of an output signal OUT is kept constant.

Further, a delay time of the RC delay circuit 63 can be suitably set depending on to which extent the pulse width of the input signal should be broadened.

These RC delay circuits can be suitably changed to other ones other than the circuit shown in FIG. 7.

According to the circuits of the present invention, as have been described above in detail, when the glitch noise is input, the signal having the pulse width corresponding to the pulse width of the noise can be outputted. Thus, since the signal whose pulse width is broad, is not inputted to the next-stage circuit, it is possible to avoid malfunctioning.

While the present invention has been described with reference to the illustrative embodiments, this description is not intended to be construed in a limiting sense. Various modifications of the illustrative embodiments, as well as other-embodiments of the invention, will be apparent to those skilled in the art on reference to this description. It is therefore contemplated that the appended claims will cover any such modifications or embodiments as fall within the true scope of the invention.

What is claimed is:

1. A pulse extending circuit comprising:
   an input terminal receiving an input signal;
   a first delay circuit having an input coupled to said input terminal and receiving said input signal, and having an output providing a delayed input signal;
   a first NAND circuit having a first input terminal coupled to said output of said first delay circuit and receiving said delayed input signal, a second input terminal coupled to said input terminal and receiving said input signal, and an output providing a first NAND output signal;
   a second delay circuit having an input coupled to said output of said first NAND circuit and receiving said first NAND output signal and having an output providing a delayed first NAND output signal;
   a first inverter having an input coupled to said input terminal and receiving said input signal, and having an output providing an inverted input signal; and
   a second NAND circuit having a first input terminal coupled to said output of said second delay circuit and receiving said delayed first NAND output signal, and having a second input terminal coupled to said output of said first inverter and receiving said inverted input signal.

2. A pulse extending circuit as claimed in claim 1, wherein said delayed input signal changes from a first logic level to a second logic level in response to a change of said input signal from the first logic level to the second logic level, after a first predetermined period has elapsed, and wherein said delayed input signal changes from the second logic level to the first logic level in response to a change of the input signal from the second logic level to the first logic level without waiting for said first predetermined period to elapse, and further wherein said delayed first NAND output signal changes from a first logic level to a second logic level in response to a change of said first NAND output signal from the first logic level to the second logic level, after a second predetermined period has elapsed, and wherein said delayed first NAND output signal changes from the second logic level to the first logic level in response to a change of said first NAND output signal from the second logic level to the first logic level without waiting for said second predetermined period to elapse.

3. A pulse extending circuit as claimed in claim 1, wherein said first delay circuit comprises:
- a second inverter having a P channel MOS transistor connected between a source potential and said output of said first delay circuit and a resistor and an N channel MOS transistor series-connected between the output of said first delay circuit and a ground potential;
- a capacitor connected between the output of said second inverter and the ground potential; and
- a third inverter connected to the output of said second inverter.

4. A pulse extending circuit as claimed in claim 2, wherein said first delay circuit comprises:
- a second inverter having a P channel MOS transistor connected between a source potential and said output of said first delay circuit and a resistor and an N channel MOS transistor series-connected between the output of said first delay circuit and a ground potential;
- a capacitor connected between the output of said second inverter and the ground potential; and
- a third inverter connected to the output of said second inverter.

5. A pulse extending circuit as claimed in claim 1, wherein said second delay circuit comprises:
- a second inverter having a P channel MOS transistor connected between a source potential and said output of said first delay circuit and a resistor and an N channel MOS transistor series-connected between the output of said first delay circuit and a ground potential;
- a capacitor connected between the output of said second inverter and the ground potential; and
- a third inverter connected to the output of said second inverter.

6. A pulse extending circuit as claimed in claim 1, wherein said first and second delay circuits each comprise an even number of inverters.

7. A pulse extending circuit comprising:
- an input terminal receiving an input signal;
- a first delay circuit having an input coupled to said input terminal and receiving said input signal, and having an output providing a delayed input signal;
- a first NOR circuit having a first input terminal coupled to said output of said first delay circuit and receiving said delayed input signal, a second input terminal coupled to said input terminal and receiving said input signal, and an output providing a first NOR output signal;
- a second delay circuit having an input coupled to said output of said first NOR circuit and receiving said first NOR output signal and having an output providing a delayed first NOR signal;
- a first inverter having an input coupled to said input terminal and receiving said input signal, and having an output providing an inverted input signal; and
- a second NOR circuit having a first input terminal coupled to said output of said second delay circuit and receiving said delayed first NOR output signal, and having a second input terminal coupled to said output of said first inverter and receiving said inverted input signal.

8. A pulse extending circuit as claimed in claim 7, wherein said delayed input signal changes from a first logic level to a second logic level in response to a change of said input signal from the first logic level to the second logic level, after a first predetermined period has elapsed, and wherein said delayed input signal changes from the second logic level to the first logic level in response to a change of the input signal from the second logic level to the first logic level without waiting for said first predetermined period to elapse, and further wherein said delayed first NOR output signal changes from a first logic level to a second logic level in response to a change of said first NOR output signal from the first logic level to the second logic level, after a second predetermined period has elapsed, and wherein said delayed first NOR output signal changes from the second logic level to the first logic level in response to a change of said first NOR output signal from the second logic level to the first logic level without waiting for said second predetermined period to elapse.

9. A pulse extending circuit as claimed in claim 7, wherein said first delay circuit comprises:
- a second inverter having a P channel MOS transistor and a resistor series-connected between a source potential and said output of said first delay circuit and an N channel MOS transistor connected between the output of said first delay circuit and a ground potential;
- a capacitor connected between the output of said second inverter and the source potential; and
- a third inverter connected to the output of said second inverter.

10. A pulse extending circuit as claimed in claim 8, wherein said first delay circuit comprises:
- a second inverter having a P channel MOS transistor and a resistor series-connected between a source potential and said output of said first delay circuit and an N channel MOS transistor connected between the output of said first delay circuit and a ground potential;
- a capacitor connected between the output of said second inverter and the ground potential; and
- a third inverter connected to the output of said second inverter.

11. A pulse extending circuit as claimed in claim 7, wherein said second delay circuit comprises:
- a second inverter having a P channel MOS transistor and a resistor series-connected between a source potential and said output of said first delay circuit and an N channel MOS transistor connected between the output of said first delay circuit and a ground potential;
- a capacitor connected between the output of said second inverter and the source potential; and
- a third inverter connected to the output of said second inverter.

12. A pulse extending circuit as claimed in claim 7, wherein said first and second delay circuits each comprise an even number of inverters.

* * * * *